(12) United States Patent
Barink et al.

(10) Patent No.: US 11,516,909 B2
(45) Date of Patent: Nov. 29, 2022

(54) STRETCHABLE ELECTRONIC DEVICE

(71) Applicant: Nederlandse Organisatie voor toegepast-natuurwetenschappelijk onderzoek TNO, 's-Gravenhage (NL)

(72) Inventors: Marco Barink, Eindhoven (NL); Edsger Constant Pieter Smits, Eindhoven (NL); Jeroen Van Den Brand, Goirle (NL)

(73) Assignee: Nederlandse Organisatie voor toegepast-natuurwetenschappelijk onderzoek TNO, 's-Gravenhage (NL)

( * ) Notice: Subject to any disclaimer, the term of this patent is extended or adjusted under 35 U.S.C. 154(b) by 0 days.

(21) Appl. No.: 17/053,483

(22) PCT Filed: May 21, 2019

(86) PCT No.: PCT/NL2019/050296
§ 371 (c)(1),
(2) Date: Nov. 6, 2020

(87) PCT Pub. No.: WO2019/226048
PCT Pub. Date: Nov. 28, 2019

(65) Prior Publication Data
US 2021/0136913 A1    May 6, 2021

(30) Foreign Application Priority Data

May 25, 2018 (EP) .................... 18174353

(51) Int. Cl.
*H05K 1/02* (2006.01)
*H05K 1/18* (2006.01)
*H05K 3/28* (2006.01)

(52) U.S. Cl.
CPC ......... *H05K 1/0283* (2013.01); *H05K 1/0277* (2013.01); *H05K 1/189* (2013.01);
(Continued)

(58) Field of Classification Search
CPC ................. H05K 1/0283; H05K 1/189; H05K 2201/0129; H05K 2201/0145;
(Continued)

(56) References Cited

U.S. PATENT DOCUMENTS 4,774,434 A * 9/1988 Bennion ................ H05K 1/189
313/511
5,848,462 A   12/1998 Sera et al.
(Continued)

FOREIGN PATENT DOCUMENTS

DE      3905657 A1    8/1990

OTHER PUBLICATIONS

English Translation DE3905657A1, Bauer et al., Telefunken Electronic GmbH (Year: 1990).*
(Continued)

*Primary Examiner* — Steven T Sawyer
(74) *Attorney, Agent, or Firm* — Leydig, Voit & Mayer, Ltd.

(57) ABSTRACT

An electronic device (100) comprises a stretchable substrate (30) with a flap (30f) formed by a cut (40) in the substrate (30). The flap (30f) is disconnected by the cut (40) from a surrounding main section (30m) of the substrate (30) except on one side. The flap (30f) is exclusively connected to the main section (30m) via a connected section (30c) of the substrate (30) between two ends (40a, 40b) of the cut (40). An electronic component (10) is disposed on the flap (30f) with electrical contacts (11,12) connected to conductive tracks (21,22) disposed on the substrate (30). The conductive tracks (21,22) extend between the component (10) disposed on the flap (30f), and other parts (10r) of the electronic device (100) outside the flap (30f) via the con-
(Continued)

nected section (30c). The flap (30f) with the component (10) is disposed in a pocket formed by surrounding lamination layers (31,32).

14 Claims, 6 Drawing Sheets

(52) U.S. Cl.
CPC ..... *H05K 3/281* (2013.01); *H05K 2201/0129* (2013.01); *H05K 2201/0145* (2013.01); *H05K 2201/09081* (2013.01); *H05K 2201/09281* (2013.01)

(58) Field of Classification Search
CPC .......... H05K 2201/09081; H05K 2201/10106; H05K 1/0277; H05K 1/028; H05K 1/118; H05K 1/147; H05K 2201/05; H05K 2201/2009

See application file for complete search history.

(56) References Cited

U.S. PATENT DOCUMENTS

| | | |
|---|---|---|
| 2008/0019120 A1 | 1/2008 | Rapisarda |
| 2010/0124060 A1* | 5/2010 | Wang ..................... H05K 1/189 |
| | | 362/249.02 |
| 2011/0075384 A1* | 3/2011 | Yeates .................... H05K 1/189 |
| | | 361/752 |
| 2014/0055974 A1* | 2/2014 | Hansen ................ H05K 5/0056 |
| | | 361/804 |
| 2014/0268780 A1 | 9/2014 | Wang et al. |
| 2015/0189736 A1* | 7/2015 | Yang ..................... H05K 1/0283 |
| | | 361/749 |
| 2017/0223846 A1* | 8/2017 | Elolampi ............... H05K 3/284 |
| 2018/0084643 A1* | 3/2018 | Baxi ...................... H05K 1/112 |
| 2018/0094781 A1* | 4/2018 | Schlosser ................. F21V 7/28 |
| 2020/0267844 A1* | 8/2020 | Lim ..................... H05K 1/0277 |

OTHER PUBLICATIONS

European Patent Office, International Search Report in corresponding International Application No. PCT/NL2019/050296, dated Nov. 26, 2019 (4 pages).

* cited by examiner

STRETCHABLE ELECTRONIC DEVICE

CROSS-REFERENCE TO RELATED APPLICATIONS

This patent application is a U.S. National Phase of PCT International Application No. PCT/NL2019/050296, filed May 21, 2019, which claims priority to European Application No. 18174353.5 filed May 25, 2018, which are both expressly incorporated by reference in their entireties, including any references contained therein.

TECHNICAL FIELD AND BACKGROUND

The present disclosure relates to stretchable electronics, in particular an electronic device comprising a stretchable substrate with relatively rigid or non-stretchable components. The disclosure also relates to methods method of manufacturing such electronics.

Stretchable electronics can be made by direct printing of a stretchable conductive ink on a stretchable substrate in combination with the placement of electrical components such as surface mounted devices (SMD). For example, these electric components can be placed onto the printed circuitry with a normal pick-and-place machine. Typically, the components are relatively stiff and/or brittle. When the substrate is stretched or flexed—with these stiff components attached to the substrate—the device may experiences significant additional stress/strain just next to these components (in the area of the electrical interconnect). These stress/strain levels are much higher compared to the stress/strain level within the substrate and the printed circuitry. Hence, the component interconnects may have increased high risk of failure far more than the printed circuitry elsewhere.

The problem may be alleviated e.g. by applying globtops, underfill and trying different inks, ICA's and bonding techniques. This may improve the bonding, or shift the location of the maximum stress. However, protecting the interconnects with globtops, additional underfill or other measures often (only) leads to a shift of the stress concentration. Using the smallest available components may also improves the reliability of the electronics device in stretching and bending. However, larger components such as integrated circuitry or chips allow for more advanced functionality within electrical devices. In case of PEN/PET substrates, the electronic circuitry can be designed in meanders resulting in less stress on the interconnects. However this may be insufficient especially for highly stretchable substrates like TPU.

As background, DE 39 05 657 A1 describes a flexible supporting film wherein a film region which is provided for retention of components consists of a tongue which in each case projects into an opening which is incorporated in the film. As further background, US 2008/0019120 A1 describes a lighting system for wearing apparel including a sealed housing of flexible light transmitting material with at least two hollow regions interconnected by a section having an opening therein communicating between the hollow regions, and at least one light source in each hollow region for light emission through the surface of the housing.

There remains a need to improve protection of electronic components and interconnects on stretchable and/or flexible substrates.

SUMMARY

These or other needs may be provided by aspects of the present disclosure relating to an electronic device and method of manufacturing such device. One aspect provides an electronic device comprising a stretchable substrate. The substrate comprises at least one flap. The flap can be formed by a suitable cut in the substrate. The flap may thus be disconnected by the cut from a surrounding main section of the substrate except on one side. So the flap remains exclusively connected to the main section via a connected section of the substrate between two ends of the cut, e.g. the ends of U- or similar shaped cut forming a sort of peninsula. An electronic component can be disposed on the flap with electrical contacts connected to conductive tracks disposed on the substrate. The conductive tracks may thus extend between the component disposed on the flap, and other parts of the electronic device outside the flap via the connected section. The substrate may be laminated by surrounding layers which can be locally disconnected to form a pocket around the flap with component. Another or further aspect provides a method comprising the creation of a cut in a stretchable substrate to provide the flap and providing an electronic component on the flap with electrical contacts connected to conductive tracks disposed on the substrate, wherein the conductive tracks extend between the component disposed on the flap, and other parts of the electronic device outside the flap via the connected section.

It will be appreciated that by providing a relatively rigid component on a flap or peninsula which is mostly disconnected from the rest of the surrounding (main) section of the substrate (except on one side), the substrate can be stretched or bent in various directions with minimal strain on the component. This may also improve an overall stretchability or flexibility of the substrate because the rigid part is relatively isolated. For example, when the substrate is stretched, this may result in expanding a width of the cut rather than requiring the intermediate parts of the substrate to compensate for the non-stretchability of the part of the substrate housing the rigid component. By providing the flap with the component in a pocket of surrounding lamination layers, while not being adhered to those layers, the component can be protected by the lamination layers while being minimally affected by the stretching of the surrounding substrate or lamination layers.

BRIEF DESCRIPTION OF DRAWINGS

These and other features, aspects, and advantages of the apparatus, systems and methods of the present disclosure will become better understood from the following description, appended claims, and accompanying drawing wherein:

DESCRIPTION OF EMBODIMENTS

Figure 1:
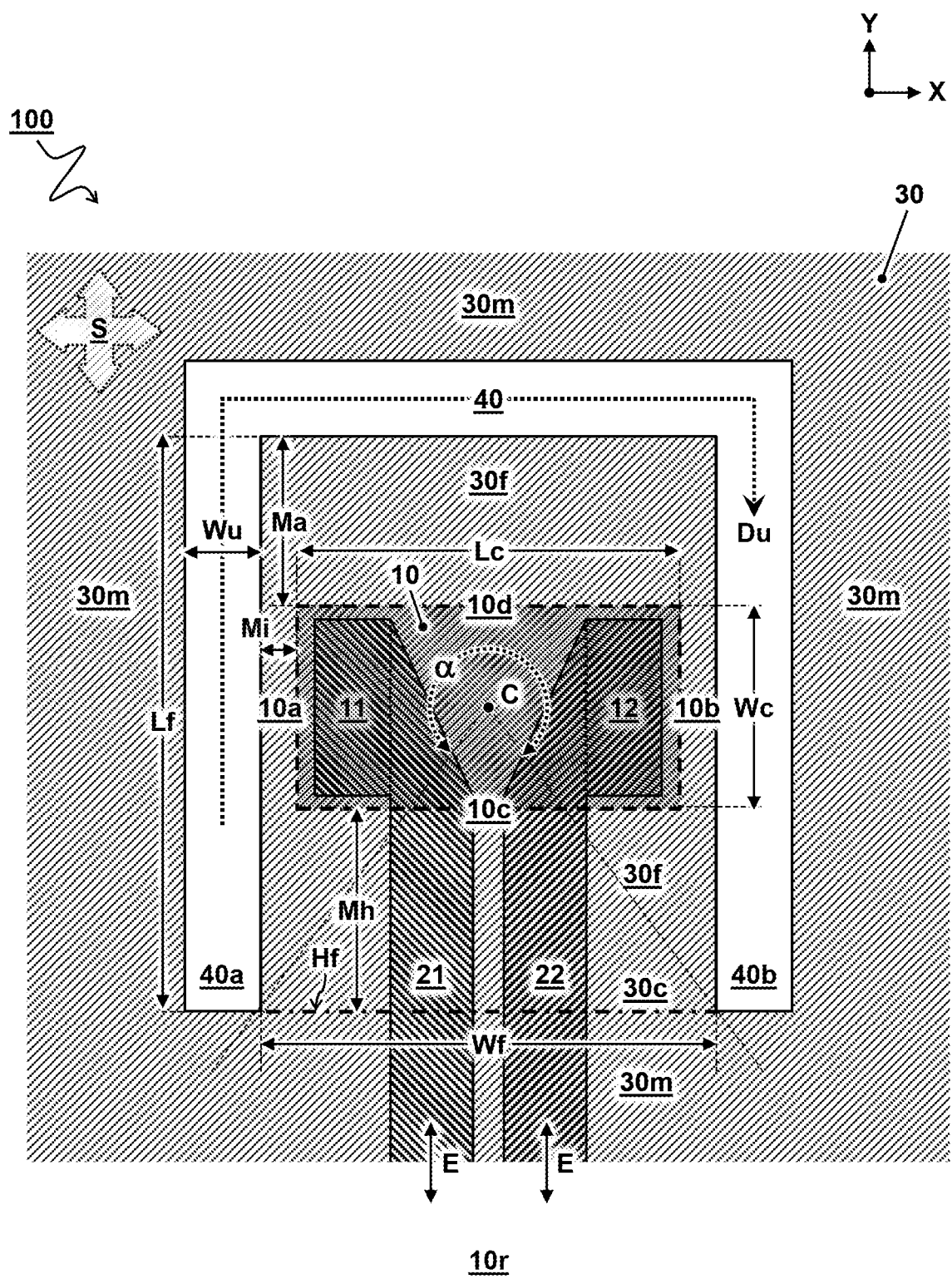
FIG. 1 schematically shows a plan view of an electronic device 100 illustrating aspects according to some embodiments.

Terminology used for describing particular embodiments is not intended to be limiting of the invention. As used herein, the singular forms "a", "an" and "the" are intended to include the plural forms as well, unless the context clearly indicates otherwise. The term "and/or" includes any and all combinations of one or more of the associated listed items. It will be understood that the terms "comprises" and/or "comprising" specify the presence of stated features but do not preclude the presence or addition of one or more other features. It will be further understood that when a particular step of a method is referred to as subsequent to another step, it can directly follow said other step or one or more intermediate steps may be carried out before carrying out the particular step, unless specified otherwise. Likewise it will be understood that when a connection between structures or components is described, this connection may be established directly or through intermediate structures or components unless specified otherwise.

The invention is described more fully hereinafter with reference to the accompanying drawings, in which embodiments of the invention are shown. In the drawings, the absolute and relative sizes of systems, components, layers, and regions may be exaggerated for clarity. Embodiments may be described with reference to schematic and/or cross-section illustrations of possibly idealized embodiments and intermediate structures of the invention. In the description and drawings, like numbers refer to like elements throughout. Relative terms as well as derivatives thereof should be construed to refer to the orientation as then described or as shown in the drawing under discussion. These relative terms are for convenience of description and do not require that the system be constructed or operated in a particular orientation unless stated otherwise.

FIG. 1 schematically shows a plan view (X,Y) of an electronic device 100 illustrating various aspects according to some embodiments. As described herein, the electronic device 100 comprises a stretchable substrate 30 with at least one flap 30f and at least one electronic component 10 disposed on the flap 30f.

In principle, the flap 30f may be formed by any suitably shaped cut 40 in the substrate 30. Preferably, the flap 30f is disconnected by the cut 40 from a surrounding main section 30m of the substrate 30 except on one side. Most preferably, the flap 30f is exclusively connected to the main section 30m via a connected section 30c of the substrate 30 between two ends 40a,40b of the cut 40. Preferably, the flap 30f is exclusively connected to the main section 30m of the substrate 30 on one side, i.e. via the connected section 30c. In some embodiments, e.g. as shown, the cut 40 may be described as preferably extending along at least three sides or faces 10a,10b,10d of the component 10. For example, in the shown orientation (as viewed from the top), the connected section 30c is only disposed at the lower side 10c of the component 10 while the left side 10a, right side 10b, and upper side 10d of the component 10 are all faced towards a part of the cut 40. Of course these are relative terms depending on the viewing orientation.

Preferably, the cut 40 as described herein has substantial "U-shape" which term may be understood as an arced (e.g. squared or rounded) cut which extends in different directions "Du" over its cut length around a perimeter of the component 10. For example, the cut direction "Du" changes over an angle (in plane of the substrate) of at least ninety degrees, preferably at least hundred eighty degrees (e.g. the cut shown in FIG. 1, or otherwise), or more than two-hundred degrees (e.g. the cut shown in FIG. 2, 3 or otherwise). Alternatively, or additionally, the cut 40 may be described as extending between its ends 40a,40b over a certain angle "α" (in plane of the substrate) around a (geometric) center of the component 10, e.g. wherein the angle "α" is at least hundred eighty degrees, preferably more than two-hundred-fifty degrees, more than two-hunched-seventy degrees, or even more than three-hundred degrees. The more the cut goes around the component, the better the mechanical isolation.

Typically, the cut length (not indicated) may be much larger than the cut width "Wu". For example, a length of the cut (transverse to the width) is at least five or ten times a width of the cut. While the cut width "Wu" in principle may be zero or close to zero (i.e. simply disconnected), preferably, the cut width "Wu" is bit larger so the edges of the flap 30f are free of the surrounding main section 30m allowing relative lateral movement. For example, the cut width "Wu" is typically more than one or two millimeter. Alternatively, or additionally, the cut width "Wu" is preferably at least ten, twenty, or even fifty percent of a minimum component dimension, in this case the width "Wc" of the component 10. The cut width "Wu" may also be selected relative to the flap width (e.g. ill a direction transverse to the cut, i.e. along the cut width direction as indicated), e.g. at least ten, twenty, or even fifty percent of the (maximum) flap width "Wf". The cut with is preferably, though not necessarily, the same on all sides of the component (in unstretched condition of the substrate).

Preferably, a maximum flap margin "Ma" or distance between the circumferential cut 40 and an edge of the component 10 and/or conductive tracks 21,22 is relatively small, e.g. less than a size (e.g. length "Lc" or width "Wc") of the component 10. Also, the minimum margin "Mi" can be as small as possible. Accordingly, the footprint of the flap with component can be relatively small. For example, the maximum flap margin "Ma" is less than five millimeter, preferably less than two millimeter, less than one millimeter, or even less than half a millimeter, or as small as possible. For example, the total flap area may be around one square centimeter, preferably less than eight by eight millimeter or even less than two by two millimeter.

It will be appreciated that the present teachings may provide particular benefit in situations where a relatively rigid component 10 is disposed on a relatively stretchable and/or flexible substrate. So the substrate 30 preferably has a relatively high stretchability, at least compared to the component 10. For example, the component have little or no stretchability e.g. lose functionality when it is attempted to stretch the component by as little as a five or ten percent. Conversely, the substrate may be highly stretchable along one or more directions to expand its size (e.g. length) along the said one or more directions without breaking by a factor of at least five percent (or factor 1.05), preferably at least ten percent (factor 1.1), more preferably at least twenty percent (factor 1.1), or even more, e.g. up to two-hundred percent, or more. Preferably the stretching of the substrate is fully or at least partially reversible, i.e. elastic stretching wherein the substrate may regain its original shape after the stretching forces are removed.

In a possible quantification, the substrate (material) preferably has an elastic modulus (e.g. Young's modulus) much lower than that of the component, e.g. by at least a factor ten, twenty, hundred, or more. For example, the Young's modulus of the substrate is preferably less than five Gigapascals such as Polyethylene terephthalate (PET) with typical Young's modulus between 2-2.7 GPa. Other or further possible substrate materials may include e.g. Polyethylene naphthalate (PEN). The teachings may particularly provide benefit also to highly stretchable materials such as thermoplastic urethane (TPU). For example, the Young's modulus of the substrate may be less than one gigapascal (e.g. measured at room temperature of 25° C.). Alternatively, or in addition to providing a substrate with relatively flexible and/or stretchable material, the substrate may also be relatively thin, e.g. one millimeter thickness, or less, typically less than six hundred micrometer, or even less.

Similar stretchability may also desired for the conductive tracks 21,22 disposed on the stretchable substrate. For example, the stretchable conductive tracks 21,22 may be elongated along their length before losing essential (conductive) functionality by at least ten percent, at least twenty percent, at least thirty percent, or even more than forty percent. For example, a conductive ink (e.g. silver) can be used, preferably printed on the substrate. Additionally, or alternatively, to improve or maintain stretchability and/or flexibility of the substrate, the tracks can be arranged with stretchable and/or flexible patterns, e.g. meandering patterns (not shown).

In the figure, an edge "Hf" of the connected section 30c of the flap 30f is indicated by the dash-dotted line. As shown, the edge "Hf" of the flap 30f extends between the two ends 40a,40b of the elongate cut 40. It may be considered as the furthest connected edge of the flap 30f where it transitions into the main section 30m. Accordingly, the edge "Hf" may function as the furthest hinge-line about which flap 30f is allowed to hinge or to flap with respect to the main section 30m by provision of the U-shaped cut line there between. Of course it will be appreciated that due to the overall flexibility of the substrate material from which the flap 30f is also formed, the flap may bend over the whole flap margin "Mh" between the component 10 and the edge "Hf" of the connected section 10c of the flap 10f.

In a preferred embodiment, the component 10 is disposed entirely on the flap 30f surrounded on all but one side 10c by the cut 40. Most preferably, the component 10 is distanced by a flap margin "Mh" from the edge "Hf" the connected section 30c. For example, the flap margin "Mh" may be have a relative size determined in comparison with a minimum bending radius over which the substrate (or more specifically the connected section 30c with conductive tracks 21,22) can be bent without the electronic component losing essential functionality, e.g. the relative size is at least five percent, ten percent, twenty percent, or even more than a factor half, i.e. the flap margin "Mh" is preferably more than half the minimum bending radius. This means that the component may flap out of plane over an angle of at least half a radian or about thirty degrees without loosing functionality which is found typically sufficient to prevent damage.

Another or further measure may be that the flap margin "Mh" preferably has a relative size compared to a (smallest) dimension or width "Wc" of the component (in plane of the substrate) of at least a factor of ten percent, twenty percent, fifty percent, or even more than a factor one, i.e. the flap margin "Mh" is preferably equal or higher than the smallest component size. It will be appreciated that the higher the relative flap margin, the better the component on the flap may be shielded from influence of stretching the surrounding main section 30m of the substrate 30.

Typically, the electronic component 10 is disposed on the flap 30f with electrical contacts 11,12 connected to conductive tracks 21,22 disposed on the substrate 30. So, the conductive tracks 21,22 may extend between the component 10 disposed on the flap 30f, and other parts 10r of the electronic device 100 outside the flap 30f via the connected section 30c. In some embodiments, the component 10 on the flap may be electrically connected to other parts 10r of the electronic device 100, e.g. via electrical connections "E" formed between the component 10 and the other parts 10r by the conductive tracks 21,22 which cross the edge "Hf" of the connected section 30c of the flap 30f. For example, the other parts 10r may be disposed on the main section 30m of the substrate (not shown) and/or other flaps (e.g. shown in FIG. 4B), or not even on the substrate, e.g. connected with wiring to the substrate (not shown). For example, the other parts may comprise other or similar electronic components such electro-optical devices, power source and/or storage devices.

Figure 2:
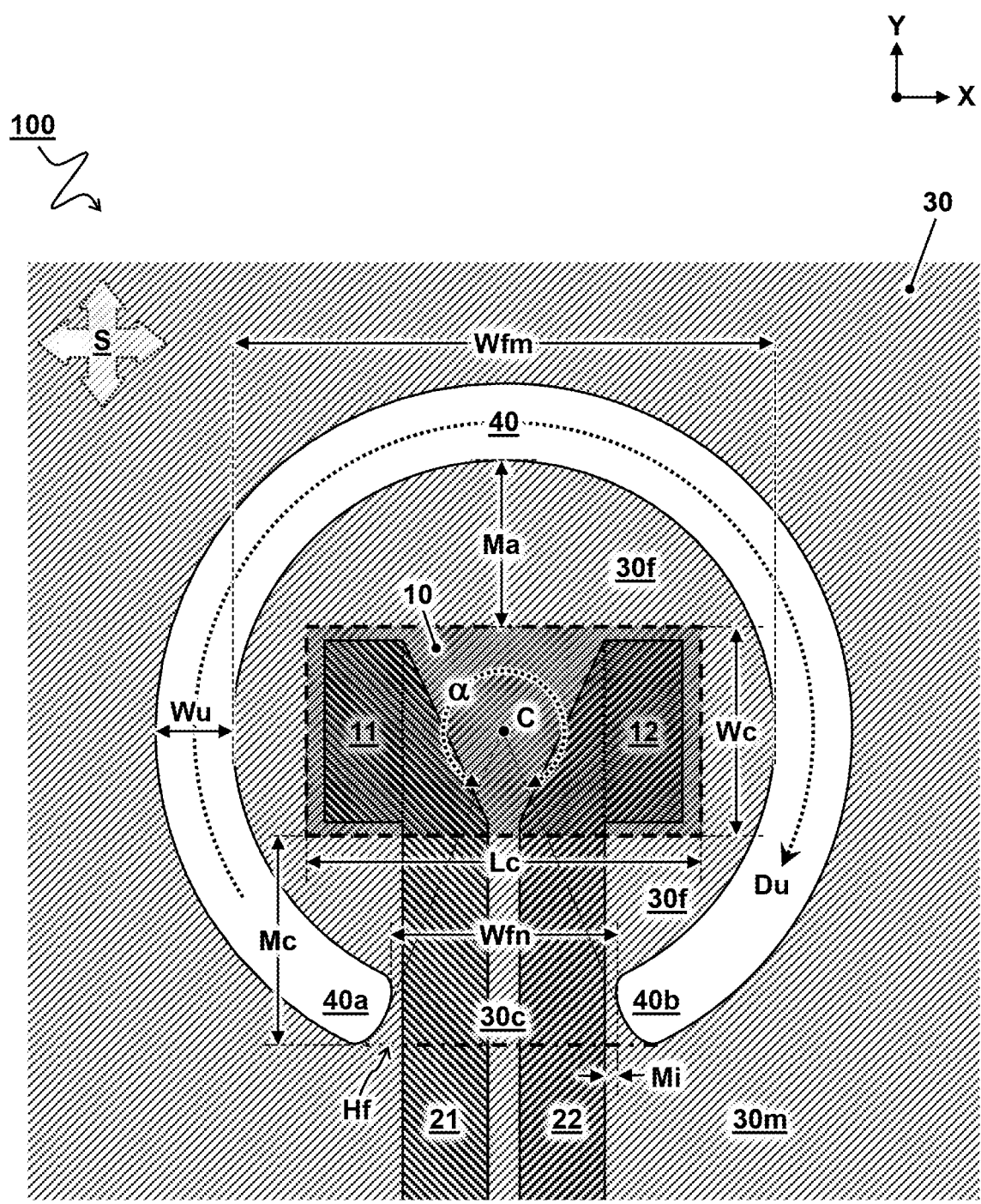
FIG. 2 schematically shows another plan view illustrating similar aspects as FIG. 1 except with a more preferable cut shape.

FIG. 2 schematically shows another plan view illustrating similar aspects as FIG. 1 except with a more preferable cut shape.

In a preferred embodiment, the cut 40 has a rounded shape, e.g. (semi) circular, oval, or at least having rounded corners (not shown here). A rounded cut may have advantages such as having more direction independent freedom (the peninsular can similarly move in any lateral direction), especially when the cut is further extended around the component (higher cut width "Wu").

In another or further preferred embodiment, a width of the flap 30f tapers at the connected section 30c. For example, the width "Wfn" at the connected section 30c or 'neck' of the flap 30f is preferably less than the maximum width "Wfm" of the flap, above the neck (the 'head'), by a factor 1.1, 1.2, 1.5, 2, or more. The smaller the connecting section or neck of the flab, the better isolated the non-stretchable component 10 from the surrounding main section 30m which may further improving stretchability and/or flexibility. While the embodiment shows a flap tapering at the neck by a generally (semi) circular shape, also other shapes may have a tapered anchor relatively narrow connection between the flap and rest of the substrate. For example, the cut forming the rectangular flap shown in the previous FIG. 1 may be extended bringing the ends 40a,40b closer together by a tapering extension and/or cutting partly along the indicated edge "Hf" of the flap 30f.

In some embodiments, a length "Lc" of the component is more than a width "Wc" of the component, e.g. by a factor 1.1, 1.2, 1.5, 2, or more. This may provide a desired separation between the electrical contacts 11,12 in the direction of the length "Lc" while keeping the width "Wc" relatively small. In a preferred embodiment, the component is arranged with one of its longer sides 10c facing the connected edge "Hf" of the flap 10. In other words, the length direction Lc of the component 10 is along the connected edge "Hf". This may allow more flexibility (compared to the transverse orientation), e.g. for flapping or rolling an appreciable portion of the flap over an axis through the connected edge "Hf". In another or further preferred embodiment, the conductive tracks 21,22 approach (and reach) the component 10 (exclusively) from one or both of its longer sides 10c,10d (so preferably not from the shorter sides 10a,10b). This may improve the bendability of the substrate and/or flap. In another or further preferred embodiment, the conductive tracks 21,22 pass below the component 10 (between the component and substrate) to approach the electrical contacts 11,12 from a center C of the component 10 outward. This may improve robustness, e.g. against peeling the component of the substrate. Also the surface may be less stiff e.g. because no glue is needed in principle at the sides next to the component. Also the conductive tracks 21,22 can be relatively close together crossing the edge "Hf" of the flap (in case this is narrower).

Figure 3:
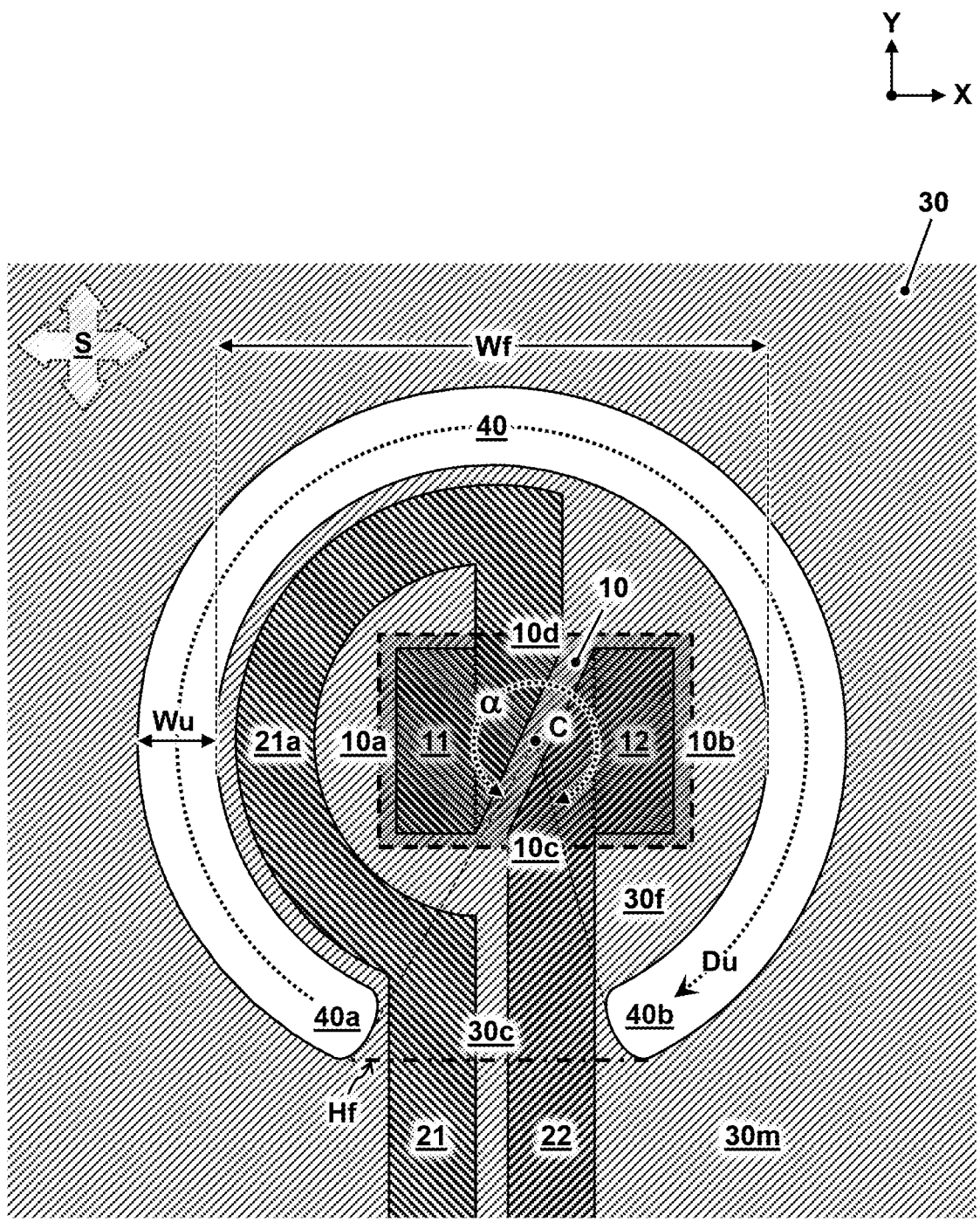
FIG. 3 schematically shows another plan view illustrating similar aspects as FIG. 2 except having a more preferable interconnect.

FIG. 3 schematically shows a plan view illustrating similar aspects as FIG. 2 except having an even more preferable interconnect.

In a preferred embodiment, e.g. as shown, conductive tracks 21,22 approach from two opposing sides 10c, 10d of the component 10. For example, a center line (not indicated) can be imagined intersecting the component 10 between its electrical contacts 11,12, e.g. preferably at its longer sides 10c,10d transverse to its shorter sides 10a,10b. For example, one conductive track 22 approaches the component along said center line and reaches the component 10 exclusively from one of its long sides 10c, and another conductive track 21 approaches the component also along said center line and reaches the electronic component exclusively from an opposite side 10d of the component. It will be appreciated comparing FIGS. 2 and 3, that this may allow a smaller component while still providing sufficient space between the electrical tracks approaching from the center below the component outward.

In some embodiments, one conductive track 21 may have a trajectory curling around the component 10 to approach from a side 10d of the component opposite the connected section 30c. In other or further embodiments, another conductive track 22 approaches the component 10 directly from a side of the connected section 30c. As shown in FIG. 3, the component 10 may be placed off center on the flap 30f, e.g. away from a side 10a where the conductive track 21 curls around the component. This may optionally be used to minimize the flap margin around the component.

Figure 4A:
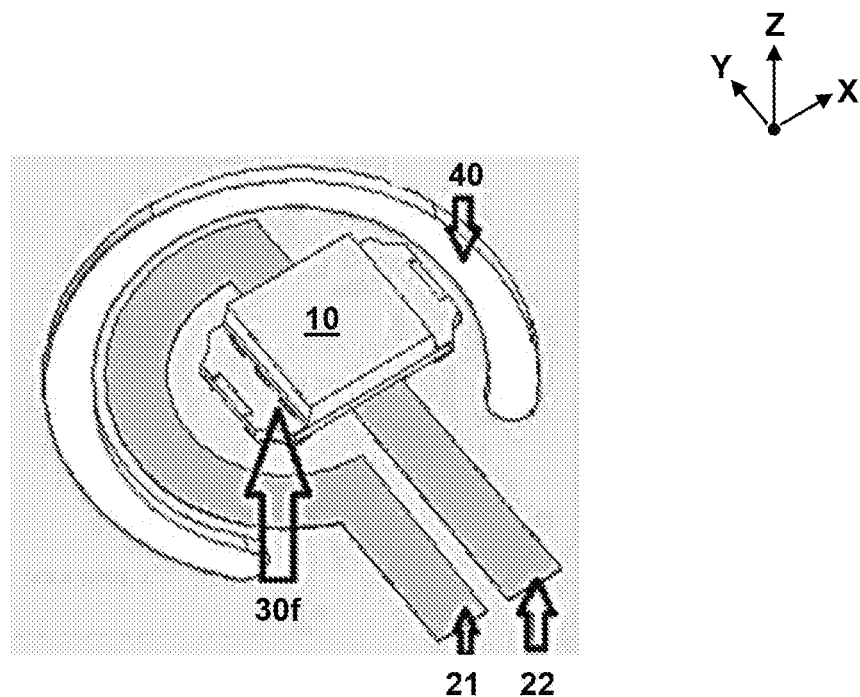
FIG. 4A schematically shows a perspective rendering of an embodiment similar as in the plan view of FIG. 3.

FIG. 4A schematically shows a perspective rendering of an embodiment similar as in the plan view of FIG. 3. For example, the component 10 may be a "picoled"

Figure 4B:
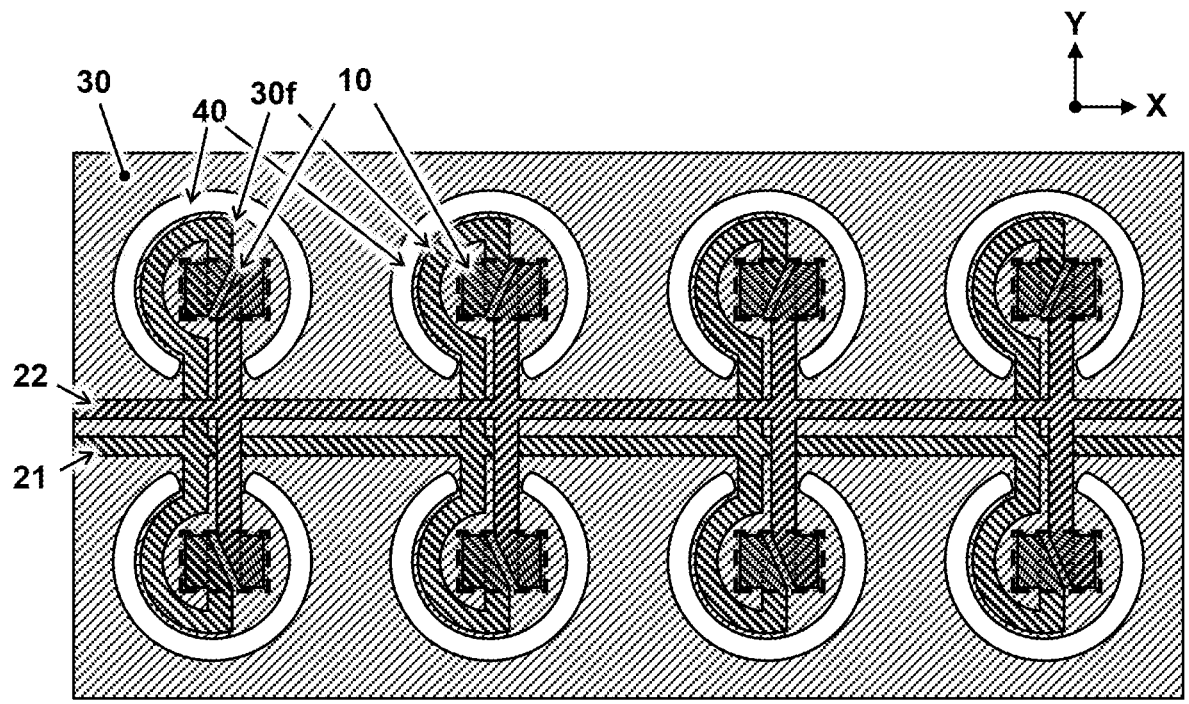
FIG. 4B schematically shows a plan view of a stretchable substrate (30) having multiple cuts (40) forming respective flaps (30f) with components (10) interconnected by conductive tracks (21,22)

FIG. 4B schematically shows a plan view of a stretchable substrate 30 having multiple cuts 40 forming respective flaps 30f with components 10 interconnected by conductive tracks 21,22. Typically, the total substrate surface may be much larger than a surface of each flap, e.g. by a factor ten, twenty, fifty, hundred, or more depending on the application. For example, the substrate 30 may comprise multiple flaps with components as described herein, e.g. more ten, twenty, fifty, hundred, or more depending on the application. While the preferred embodiments, described herein, show a single (integrated) component per flap, in principle, also multiple components may be disposed, e.g. on the same or opposite sides of the flap. By restricting the flap to a single component, the flap may be kept as small as possible.

Figure 5A:
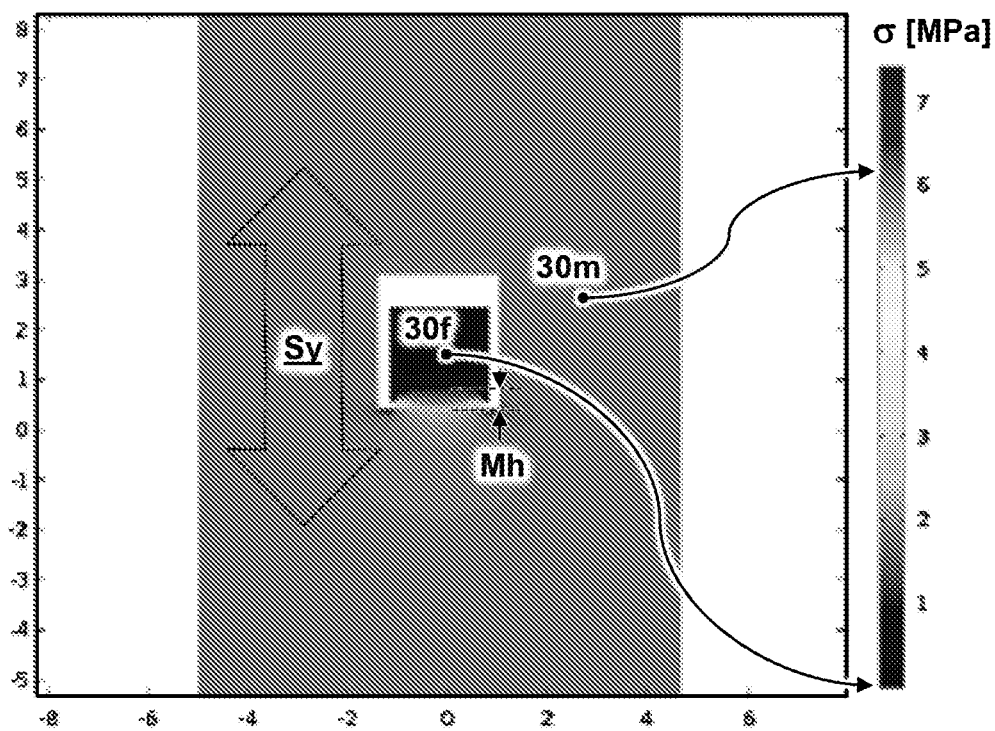
FIGS. 5A and 5B illustrate von Mises stress with a stretchable substrate loaded in vertical direction and horizontal direction, respectively.
Figure 5B:
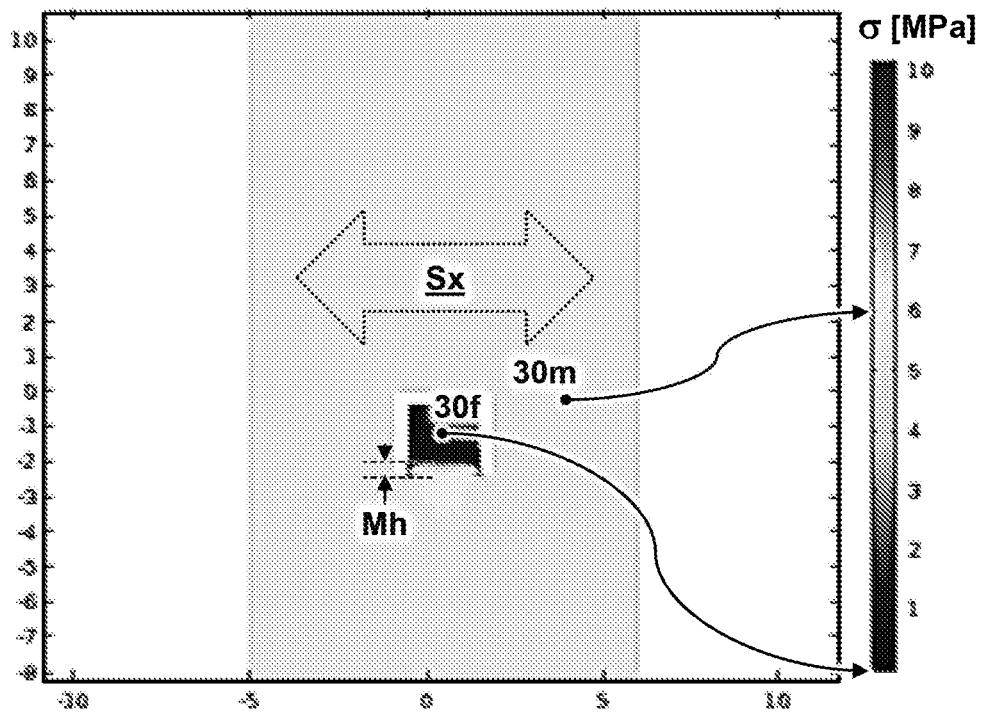

FIGS. 5A and 5B illustrate von Mises stress (o) with a stretchable substrate loaded in vertical direction or horizontal direction as indicated by the arrows Sy, Sx, respectively. It will be appreciated that the flap 30f of the substrate remains relatively free of stress while the stress at surrounding main section 30m of the substrate may experience relatively higher but uniform stress. Also, it may be noted that the stress rapidly decreases over a small flap margin "Mh" at the connected section of the flap 30f so the rigid component is preferably placed on the flap 30f beyond this margin. For example, one embodiment may comprise calculating a position or margin on the flap 30f where the stress is sufficiently reduced in comparison to the uniform stress on the main section 30m, e.g. by a factor two, three, five, ten, or more, and placing the component on the flap beyond said position or margin "Mh".

Figure 6A:
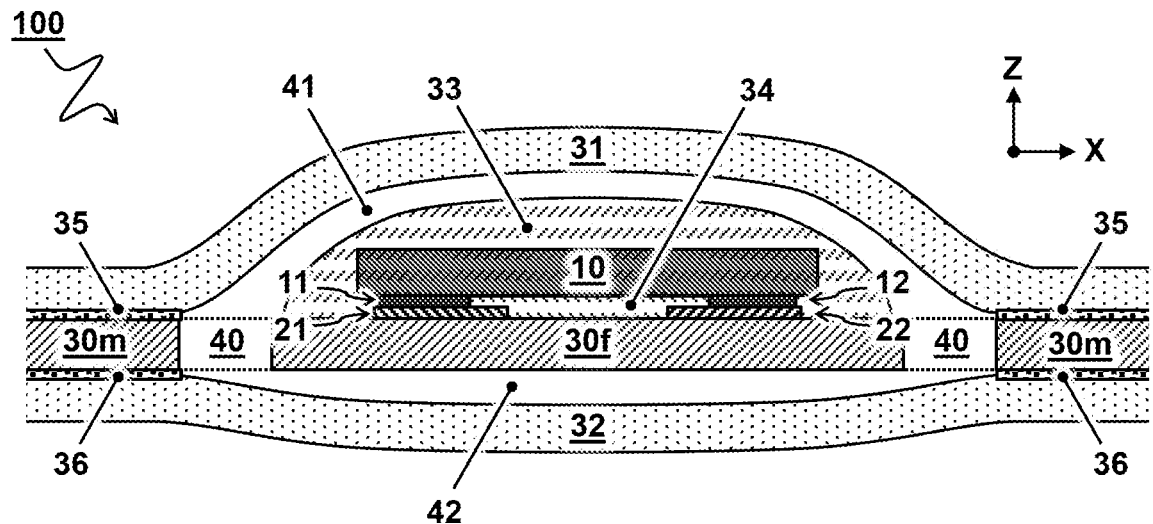
FIGS. 6A and 6B schematically show cross-section side views from two sides illustrating advantageous further aspects which may be combined with aspects such as shown in FIGS. 1-3
Figure 6B:
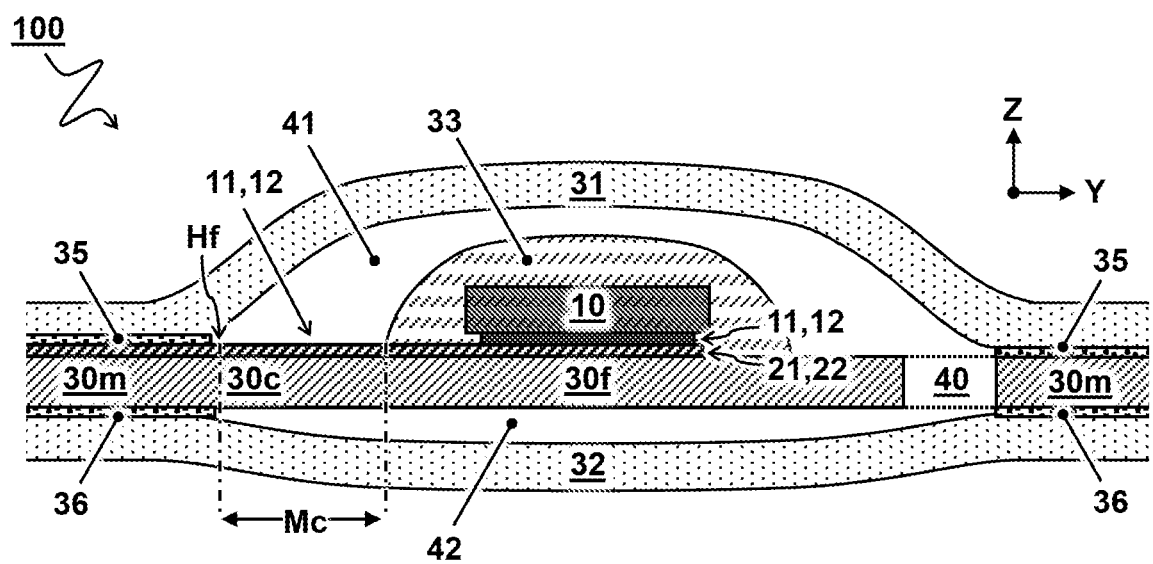

FIGS. 6A and 6B schematically show cross-section side views from two sides illustrating advantageous further aspects which may be combined with aspects, such as shown in FIGS. 1-3, or otherwise.

In some preferred embodiments, the electronic device 100 comprises one or more lamination layers 31,32. For example, a top lamination layer 31 may further protect the component 10 and/or conductive tracks 21,22. Preferably, the lamination layers 31,32 are stretchable, e.g. wherein one or more comprise the same or similar material as the substrate 30. Using similar material may provide good bonding between layers. Also, having the same or similar stretchability and/or flexibility, may help to minimally disturb these qualities in the device. An optional bottom layer can also be of the same, similar, or a different material, e.g. fabric. For example, the electronic device can be a wearable device attached or integrated with a clothing article. The stretchability of the lamination layers 31,32 can also be higher than that of the substrate 30. This may allow the flap 30f more freedom to move.

In most advantageous embodiments, the flap 30f with the component 10 is disposed in a pocket formed between one or more lamination layers 31,32. Preferably, the lamination layers 31,32 are exclusively adhered to the main section 30m of the substrate 30. In other words, the flap 30f with the component 10 is not adhered to the lamination layers 31,32. This may have the advantage that the flap 30f (and the component 10) are not forced to stretch with the lamination layers. For example, the pocket may be formed by non-adhered parts or possibly spaces 41,42 above and below the flap/component structure, interconnected by the (spacing of the) cut 40. While shown apart in the figure, the non-adhered parts of the lamination layers 31,32 may touch the intermediate flap structure there between while still being relatively free to slide or otherwise move inside the pocket.

In some embodiments, the component 10 is encased in a solid material 33 also referred to as a "glob top". The solid material 33 can be relatively rigid such as an epoxy to protect the component 10. Preferably, an extent of the solid material 33 or glob top encasing the component 10 is restricted to the flap 30f, more preferably distanced by a flap margin "Mh" from the connected edge "Hf" of the flap as previously indicated. In some embodiments, the glob-topped component can be entirely inside the aforementioned pocket formed between the by the lamination layers 31,32.

In some embodiments, the electrical contacts 11,12 are connected with the conductive tracks 21,22 by conductive adhesive, glue or solder. For example, isotropic conductive adhesive (ICA) or other material can be used. Optionally an "under fill" material 34 can be added between the electrical contacts 11,12 and/or between the component 10 and the substrate flap. This may further improve adhesion and/or structural integrity. For example, the same or similar material as the glob top can be used.

Corresponding aspects as described with respect to the electronic device may also apply to a method of manufacturing the device 100. For example, the method, may comprise creating a U-shaped cut 40 in a stretchable substrate 30 to provide a flap 30f in the substrate 30, and providing an electronic component 10 on the flap 30f with electrical contacts 11,12 connected to conductive tracks 21,22 disposed on the substrate 30 such that the conductive tracks 21,22 extend between the component 10 disposed on the flap 30f, and other parts 10r of the electronic device 100 outside the flap 30*f* via the connected section 30*c*. In some embodiments, the method may comprise application of lamination layers 31,32, wherein the flap 30*f* is arranged in a pocket between the lamination layers 31,32. Preferably, the pocket is made in a single step with the lamination.

In some embodiments, intermediate adhesive layers 35,36 can be provided exclusively between the main section 30*m* of the substrate 30 and the lamination layers 31,32 (so not between the flap 30*f* and the lamination layers 31,32). For example, the adhesive layer may comprise one or more additional layers (not shown) between the substrate 30 and the lamination layers 31,32 with holes at the position(s) of the flaps/component. For example, a layer of TPU having relatively low melting point and/or glass transition temperature) such as below 100° C., e.g. around 80° C., can be used wherein the layers are heated to selectively adhere them forming pockets. The lamination layers 31,32 can themselves also comprise TPU, or similar material (for good bonding) but having a relatively higher melting point anchor glass transition temperature, e.g. above 100° C. For example, the lamination may comprise heating the stack to an intermediate temperature melting or transitioning only the intermediate adhesive layer but not the lamination layers. So the electronic device 100 according to some embodiments may comprise e.g. five or more layers including a top laminate layer, a selective adhesive/non-adhesive layer, a substrate (with flaps, conductive tracks, under fill, the component, glob top, etc.), another selective adhesive/non-adhesive, and a bottom laminate layer (possibly fabric). Alternatively, or in addition, the adhesive layers may also comprise a glue layer e.g. exclusively applied to the main section 30*m* (and/or the lamination layers 31,32 at the position of the main section 30*m*). Alternatively, or additionally, a pressure activated adhesive can be used, wherein pressure is applied exclusively to the main section 30*m*.

For the purpose of clarity and a concise description, features are described herein as part of the same or separate embodiments, however, it will be appreciated that the scope of the invention may include embodiments having combinations of all or some of the features described. For example, while embodiments were shown for rigid electronics on stretchable substrates, also alternative ways may be envisaged by those skilled in the art having the benefit of the present disclosure for achieving a similar function and result. The various elements of the embodiments as discussed and shown offer certain advantages, such as improving reliability of stretchable devices. Of course, it is to be appreciated that any one of the above embodiments or processes may be combined with one or more other embodiments or processes to provide even further improvements in finding and matching designs and advantages. It is appreciated that this disclosure offers particular advantages to stretchable electronics, and in general can be applied for any application wherein stresses on components need to be alleviated.

In interpreting the appended claims, it should be understood that the word "comprising" does not exclude the presence of other elements or acts than those listed in a given claim; the word "a" or "an" preceding an element does not exclude the presence of a plurality of such elements; any reference signs in the claims do not limit their scope; several "means" may be represented by the same or different item(s) or implemented structure or function; any of the disclosed devices or portions thereof may be combined together or separated into further portions unless specifically stated otherwise. Where one claim refers to another claim, this may indicate synergetic advantage achieved by the combination of their respective features. But the mere fact that certain measures are recited in mutually different claims does not indicate that a combination of these measures cannot also be used to advantage. The present embodiments may thus include all working combinations of the claims wherein each claim can in principle refer to any preceding claim unless clearly excluded by context.

The invention claimed is:

1. An electronic device comprising: a stretchable substrate with a flap formed by a U-shaped cut in the stretchable substrate, wherein the flap is: disconnected by the U-shaped cut from a main section of the stretchable substrate except on one side, and exclusively connected to the main section via a connected section of the substrate between a first end and a second end of the U-shaped cut; an electronic component disposed on the flap with electrical contacts connected to conductive tracks disposed on the substrate, wherein the conductive tracks extend between the electronic component disposed on the flap, and other parts of the electronic device outside the flap via the connected section; and a first lamination layer and a second lamination layer on opposing sides of the stretchable substrate, wherein the flap with the electronic component is disposed in a pocket formed between the first lamination layer and the second lamination layer, wherein the first and second lamination layers are exclusively adhered to the main section of the stretchable substrate so the flap with the electronic component is exclusively attached to the first and second lamination layers via the connected section of the stretchable substrate; wherein the electronic component is globtopped by a solid material disposed entirely on the flap.

2. The electronic device according to claim 1, wherein the electronic component is disposed entirely on the flap surrounded on all but one side by the cut, wherein the electronic component is distanced by a flap margin from an edge of the connected section.

3. The electronic device according to claim 1, wherein the U-shaped cut extends in different directions over a cut length around a perimeter of the component, wherein the U-shaped cut extends between the first end and the second end of the U-shaped cut over an angle in a plane of the substrate around a center of the electronic component, and wherein the angle is at least two-hundred-fifty degrees.

4. The electronic device according to claim 1, wherein a width of the flap tapers at the connected section.

5. The electronic device according to claim 1, wherein the U-shaped cut has a semi-circular or a semi-oval shape.

6. The electronic device according to claim 1, wherein the stretchable substrate is stretchable to reversibly expand a size of the stretchable substrate along one or more dimensions by at least ten percent without breaking.

7. The electronic device according to claim 1, wherein the stretchable substrate has an elastic modulus lower than an elastic modulus of the electronic component, by at least a factor ten.

8. The electronic device according to claim 1, wherein the stretchable substrate has a Young's modulus of less than one gigapascal at 25° C.

9. The electronic device according to claim 1, comprising a plurality of components disposed on a respective plurality of flaps.

10. The electronic device according to claim 1, wherein a length of the electronic component is more than a width of the electronic component, wherein the electronic component is arranged with a longer of the electronic component facing a connected edge of the flap, and wherein the conductive tracks approach and reach the electronic component exclusively from one or both of longer sides of the electronic component.

11. The electronic device according to claim 1, wherein the conductive tracks pass below the electronic component between the electronic component and substrate to approach the electrical contacts from a center of the electronic component outward.

12. The electronic device according to claim 1, wherein the conductive tracks comprise a first conductive and a second conductive track that approach the electronic component from opposing sides of the electronic component, wherein the first conductive track curls around the electronic component to approach from a side of the electronic component opposite the connected section, and wherein the second conductive track approaches the electronic component directly from a side of the connected section.

13. A method of manufacturing an electronic device, the method comprising: creating a U-shaped cut in a stretchable substrate to provide a flap in the stretchable substrate, wherein the flap is: disconnected by the U-shaped cut from a main section of the stretchable substrate except on one side, and exclusively connected to the main section via a connected section of the substrate between a first end and a second end of the U-shaped cut; providing an electronic component on the flap with electrical contacts connected to conductive tracks disposed on the substrate, wherein the conductive tracks extend between the component disposed on the flap, and other parts of the electronic device outside the flap via the connected section; and providing a first lamination layer and a second layer on opposing sides of the stretchable substrate, wherein the flap with the electronic component is disposed in a pocket formed between the first lamination layer and the second lamination layer, wherein the first and second lamination layers are exclusively adhered to the main section of the stretchable substrate so the flap with the electronic component is exclusively attached to the first and second lamination layers via the connected section of the stretchable substrate; wherein the electronic component is globtopped by a solid material disposed entirely on the flap.

14. The method according to claim 13, wherein a first intermediate adhesive layer and a second intermediate adhesive layer are provided exclusively between the main section of the substrate and the first and second lamination layers.

* * * * *